(12) United States Patent
Smeloy et al.

(10) Patent No.: US 9,935,048 B2
(45) Date of Patent: Apr. 3, 2018

(54) INTEGRATED CIRCUIT INDUCTOR

(71) Applicant: Mellanox Technologies Ltd., Yokneam (IL)

(72) Inventors: Yossi Smeloy, Mitzpe Kamon (IL); Eyal Frost, Moshav Balfouria (IL)

(73) Assignee: MELLANOX TECHNOLOGIES, LTD., Yokneam (IL)

( * ) Notice: Subject to any disclaimer, the term of this patent is extended or adjusted under 35 U.S.C. 154(b) by 0 days.

(21) Appl. No.: 15/402,247

(22) Filed: Jan. 10, 2017

(65) Prior Publication Data

US 2017/0117220 A1    Apr. 27, 2017

Related U.S. Application Data

(63) Continuation of application No. 14/172,969, filed on Feb. 5, 2014, now Pat. No. 9,577,024.

(60) Provisional application No. 61/767,290, filed on Feb. 21, 2013.

(51) Int. Cl.
*H01L 23/522* (2006.01)
*H01L 49/02* (2006.01)

(52) U.S. Cl.
CPC .......... *H01L 23/5227* (2013.01); *H01L 28/10* (2013.01)

(58) Field of Classification Search
CPC ............................ H01L 23/5227; H01L 28/10
USPC .................. 257/531, 296; 361/782; 330/277; 336/200; 438/381; 333/185
See application file for complete search history.

(56) References Cited

U.S. PATENT DOCUMENTS

| | | | | |
|---|---|---|---|---|
| 2008/0036536 A1* | 2/2008 | Khorramabadi | .... | H01F 17/0013 330/252 |
| 2011/0084765 A1* | 4/2011 | Kim | ..................... | H01F 17/0013 330/277 |
| 2011/0133880 A1* | 6/2011 | Pitts | ..................... | H01F 17/0013 336/200 |
| 2012/0319236 A1* | 12/2012 | Chen | ................... | H01L 23/5227 257/531 |

* cited by examiner

*Primary Examiner* — Bo Fan
(74) *Attorney, Agent, or Firm* — D. Kligler IP Services Ltd.

(57) ABSTRACT

An inductive device is formed in a circuit structure that includes alternating conductive and insulating layers. The device includes, in a plurality of the conductive layers, traces forming a respective pair of interleaved loops and at least one interconnect segment in each of the plurality of the conductive layers. In each layer among the plurality of the conductive layers, at least one loop in the respective pair is closed by jumpers to an interconnect segment formed in another layer above or below the layer.

22 Claims, 8 Drawing Sheets

INTEGRATED CIRCUIT INDUCTOR

CROSS-REFERENCE TO RELATED APPLICATIONS

This application is a continuation of U.S. patent application Ser. No. 14/172,969, filed Feb. 5, 2014, which claims the benefit of U.S. Provisional Patent Application 61/767,290, filed Feb. 21, 2013, which is incorporated herein by reference.

FIELD OF THE INVENTION

The present invention relates generally to integrated circuit (IC) designs, and particularly to passive components that may be integrated within such designs.

BACKGROUND

IC inductors that are known in the art generally comprise a spiral metal trace in a single device layer, or possibly two oppositely-wound spirals in a pair of layers. Because of the limitations of such designs, alternative types of IC inductors have been suggested in the patent literature.

For example, U.S. Patent Application Publication 2012/0319236 describes an inductor formed from a conductive path that includes intertwined conductive lines. There may be two, three, or more than three intertwined conductive lines in the conductive path. The conductive lines may be formed from conductive structures in the dielectric stack of an integrated circuit. The dielectric stack may include metal layers that include conductive traces and may include via layers that include vias for interconnecting the traces.

As another example, U.S. Pat. No. 8,344,479 describes IC inductors that are formed by interconnecting various metal layers in an integrated circuit with continuous vias. Using continuous vias is said to improve the Q factor over existing methods for high frequency applications.

Three-dimensional IC inductors are described, for example, in PCT International Publication WO 2013/101131. Such an inductor is formed in an IC die using conductive through-body-vias, which pass through the body of the die and contact one or more metal interconnect layers on the front side of the die and terminate on the back side of the die. In another embodiment, the through-body-vias may pass through a dielectric material disposed in a plug in the body of the die. In still another aspect, a three-dimensional inductor may include conductors formed of stacks of on chip metallization layers and conductive through-layer-vias disposed in insulation layers between metallization layers.

SUMMARY

Embodiments of the present invention that are described hereinbelow provide improved designs for passive components, such as inductors, that may be embedded in multi-layer ICs.

There is therefore provided, in accordance with an embodiment of the present invention, an inductive device formed in a circuit structure that includes alternating conductive and insulating layers. The device includes, in a plurality of the conductive layers, traces forming a respective pair of interleaved loops and at least one interconnect segment in each of the plurality of the conductive layers. In each layer among the plurality of the conductive layers, at least one loop in the respective pair is closed by jumpers to an interconnect segment formed in another layer above or below the layer.

In a disclosed embodiment, the circuit structure is an integrated circuit, formed on a semiconductor wafer, with the conductive and insulating layers deposited thereon in alternation. Typically, the jumpers include vias running through an intervening insulating layer between pads at respective ends of the at least one loop and the interconnect segment.

In the disclosed embodiments, the interleaved loops in each respective pair include a first loop, including a first inner trace and a first outer trace, and a second loop, including a second inner trace and a second outer trace, such that the first inner trace is contained within the second outer trace, and the second inner trace is contained within the second outer trace. The inner and outer traces may have rectilinear shapes, while the interconnect segment runs diagonally between the inner and outer traces.

In some embodiments, the plurality of the conductive layers includes at least three or at least four successive conductive layers.

Typically, the interleaved loops in the plurality of the conductive layers are interconnected in series by links between the conductive layers. In a disclosed embodiment, the interleaved loops in the series run between a first layer and a penultimate layer among the plurality of the conductive layers and are connected to terminal contact pads located in the first layer, and the device includes, in a last conductive layer adjacent to the penultimate layer, a trace defining a further loop, which is connected by further jumpers to the interleaved loops in the penultimate layer. Alternatively, the device includes, in a last conductive layer adjacent to the penultimate layer, a trace defining a further pair of loops, which are connected by further jumpers to the interleaved loops in the penultimate layer.

There is also provided, in accordance with an embodiment of the present invention, a method for producing an inductive device in a circuit structure that includes alternating conductive and insulating layers. The method includes forming, in each of a plurality of the conductive layers, traces that define a respective pair of interleaved loops and at least one interconnect segment. Jumpers are formed between the conductive layers, such that in each layer among the plurality of the conductive layers, at least one loop in the respective pair is closed by the jumpers to an interconnect segment formed in another layer above or below the layer.

The present invention will be more fully understood from the following detailed description of the embodiments thereof, taken together with the drawings in which:

DETAILED DESCRIPTION OF EMBODIMENTS

Embodiments of the present invention provide integrated, multi-layer inductors, using three-dimensional coils made up of interconnected metal traces overlaid on one another. The coils may extend over as many successive layers as desired, limited only by the number of metal layers available in the device in question. (The successive metal layers are separate by insulating layers, with vias passing through the insulating layers, as are known in the art, to interconnect the metal traces.) Thus, such inductors may comprise traces on three, four, or even more successive conductive layers. This feature of the disclosed embodiments enables the creation of IC inductors that have high inductance, while occupying a minimal amount of chip "real estate."

In the embodiments that are shown in the figures and described in greater detail hereinbelow, each layer contains two interleaved loops, with jumpers (typically in the form of vias) to interconnect segments in the layer above or the layer below in order to bridge over the points of overlap between the loops. The loops in each layer are connected by links (typically in the form of further vias) to corresponding loops in the layer above and the layer below. The links are configured so as to create two interleaved coils, which extend from contact pads in a first metal layer (which may be the upper metal layer of the IC) through the layers of the IC device to a final metal layer of the inductor, where the ends of the coils are connected one to the other in series. The final layer may include a common contact for differential operation.

Although the disclosed embodiments relate specifically to inductors formed in an IC, in which successive metal and insulating layers are deposited on a semiconductor wafer, the principles of the present invention may similarly be applied in other sorts of multi-layer circuit structures, which may be formed, for example, on ceramic or other dielectric substrates.

Figure 1A:
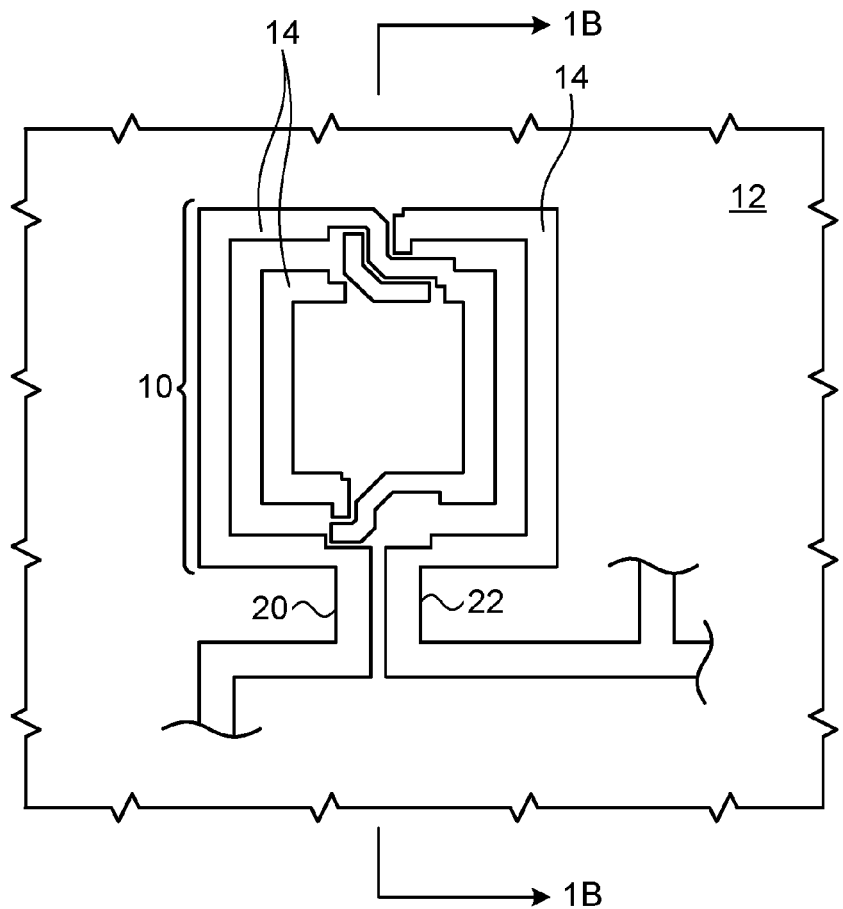
FIG. 1A is a schematic top view of an IC inductor, in accordance with an embodiment of the present invention.
Figure 1B:
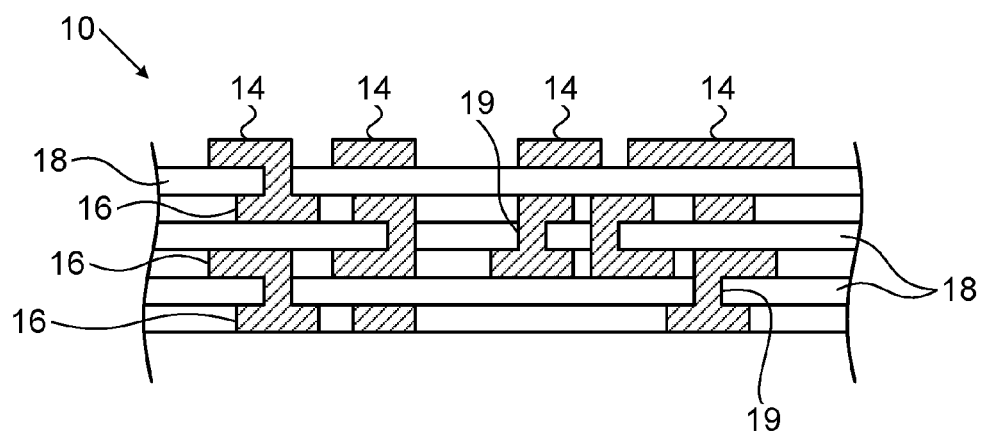
FIG. 1B is a schematic, cross-sectional view of the IC inductor of FIG. 1A.

Reference is now made to FIGS. 1A and 1B, which schematically illustrate a multi-layer IC inductor 10, in accordance with an embodiment of the present invention. FIG. 1A is a top view, showing inductor 10 on an upper surface of a wafer 12 on which the inductor is formed, while FIG. 1B is a cross-sectional view taken along the line IB-IB in FIG. 1A. Inductor 10 comprises conductive traces 14 formed in successive metal layers 16 on wafer 12. Metal layers 16 alternate with insulating layers 18, such as silicon dioxide layers, as is known in the art of IC fabrication. The traces in adjacent metal layers 16 are interconnected by vias 19, which pass through insulating layers 18. In the upper metal later, as shown in FIG. 1A, traces 14 connect to terminal contact pads 20 and 22, which connect inductor 10 to other circuit elements on or off wafer 12.

Figure 2:
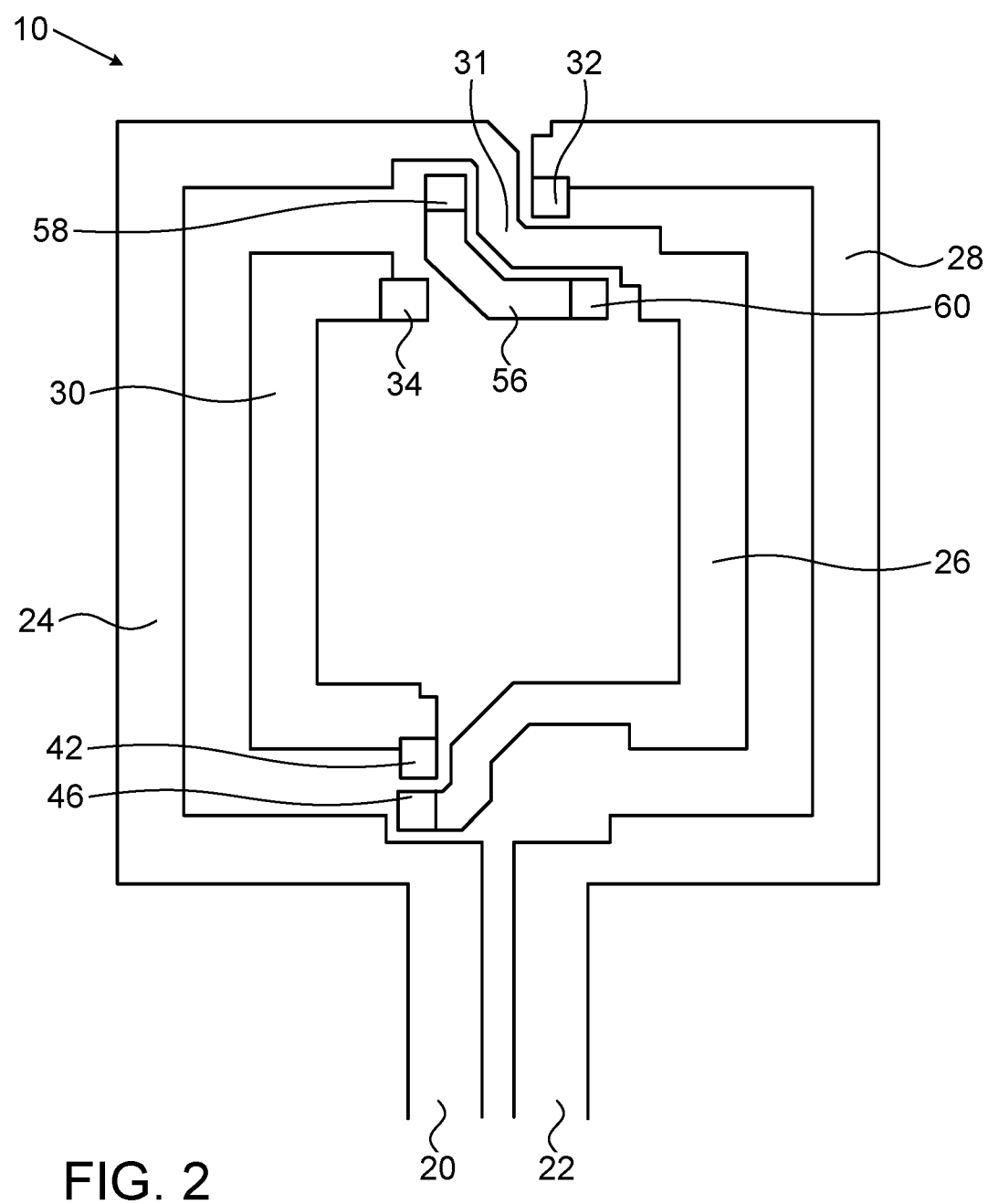
FIGS. 2-6 are schematic top views of successive layers of an IC inductor, in accordance with an embodiment of the present invention.
Figure 6:
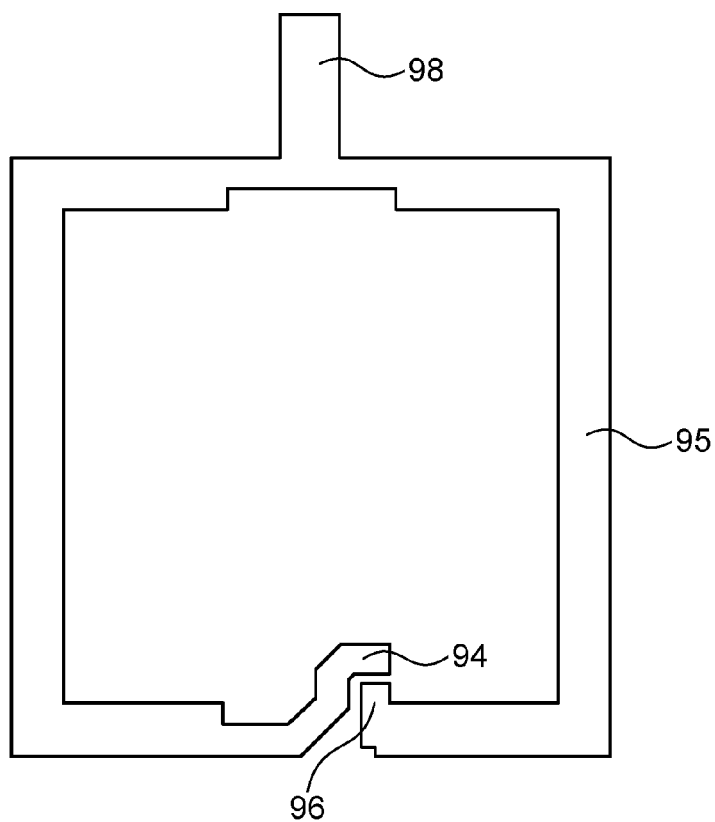

FIGS. 2-6 are schematic top views of successive metal layers of IC inductor 10, in accordance with an embodiment of the present invention. The layers are presented in descending order, from the upper metal layer (referred to in the description that follows as M5), shown in FIG. 2, via intermediate layers M4, M3 and M2, shown in FIGS. 3-5, respectively, to the lowest metal layer participating in the inductor (in this example, M1), shown in FIG. 6. For the sake of convenience, the upper layer (M5) may be referred to as the first layer, while the lowest layer (M1) is referred to as the last layer (and M2 as the "penultimate layer"), although in practice, the lowest layer is fabricated first, and the upper layer last. In an alternative embodiment, the order of the layers may be reversed, so that the first layer, as shown in FIG. 2, is formed in the lowest metal layer, while the last layer, shown in FIG. 6, is formed in the upper metal layer.

As noted earlier, inductor 10 connects to other circuit elements in the IC (or outside the IC) via terminal contact pads 20 and 22 in layer M5, as shown in FIG. 2. Pads 20 and 22 connect to respective loops: Pad 20 connects to a loop made up of an outer left trace 24 and an inner right trace 26, while pad 22 connects to another loop made up of an outer right trace 28 and an inner left trace 30. As can be seen in the figures, inner trace 26 is contained within outer trace 28, while inner trace 30 is contained within outer trace 24. Inner traces 26 and 30 and outer traces 24 and 28 have rectilinear shapes, in accordance with common practice in IC design, but traces of other, non-rectilinear shapes may alternatively be used.

Figure 3:
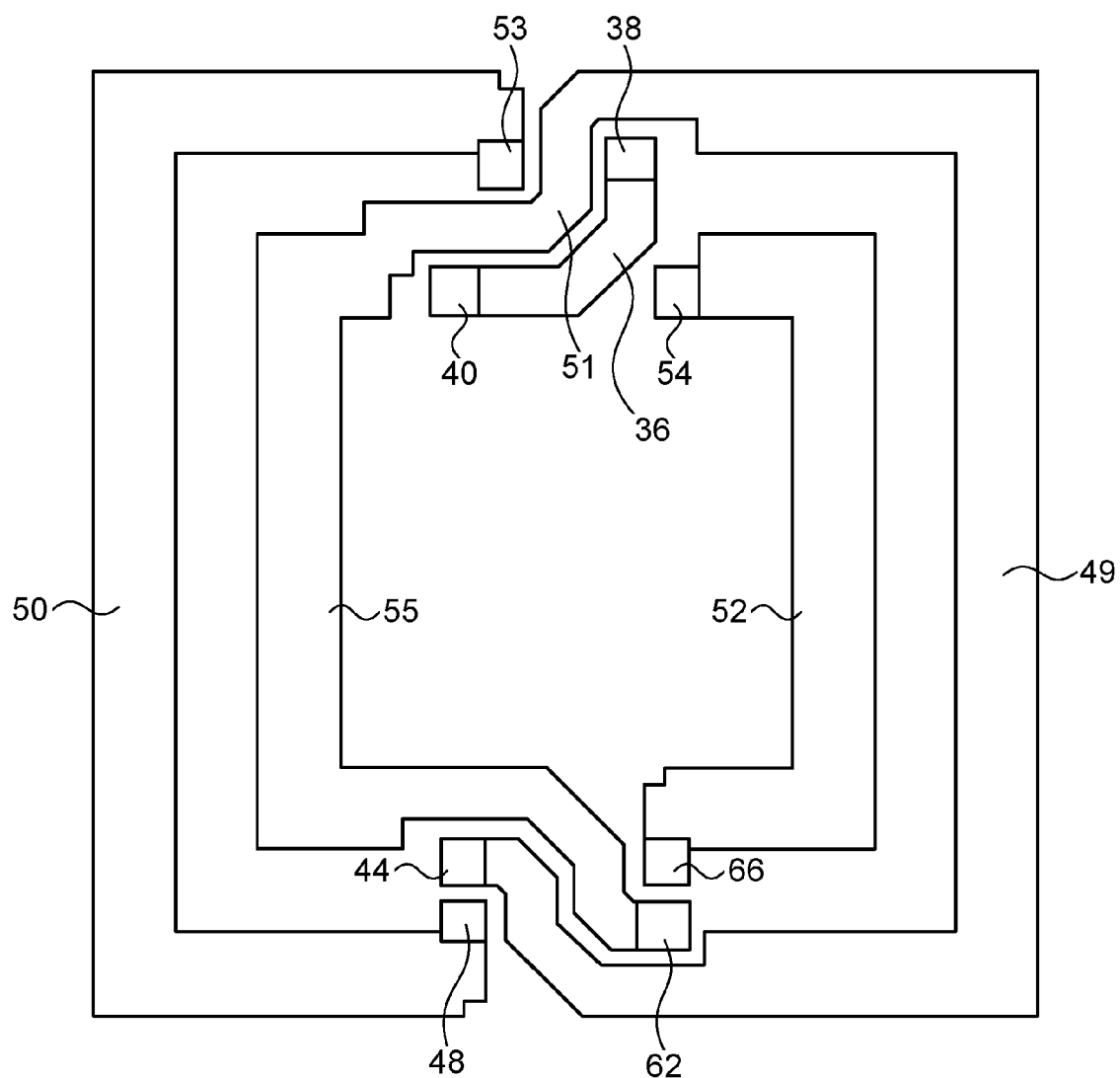

Traces 24 and 26 are connected by a diagonal segment 31 within M5, while traces 28 and 30 are connected by an interconnect segment 36 in layer M4 (FIG. 3). For this latter purpose, pads 32 and 34 at the ends of traces 28 and 30, respectively, in layer M5 are jumpered through by vias (such as vias 19 in FIG. 1B) down to corresponding pads 38 and 40 at the ends of segment 36. The two loops in layer M5 are connected by linking vias between pads 42 and 46 at the ends of traces 30 and 26, respectively, in M5 to corresponding pads 44 and 48 in layer M4.

Figure 4:
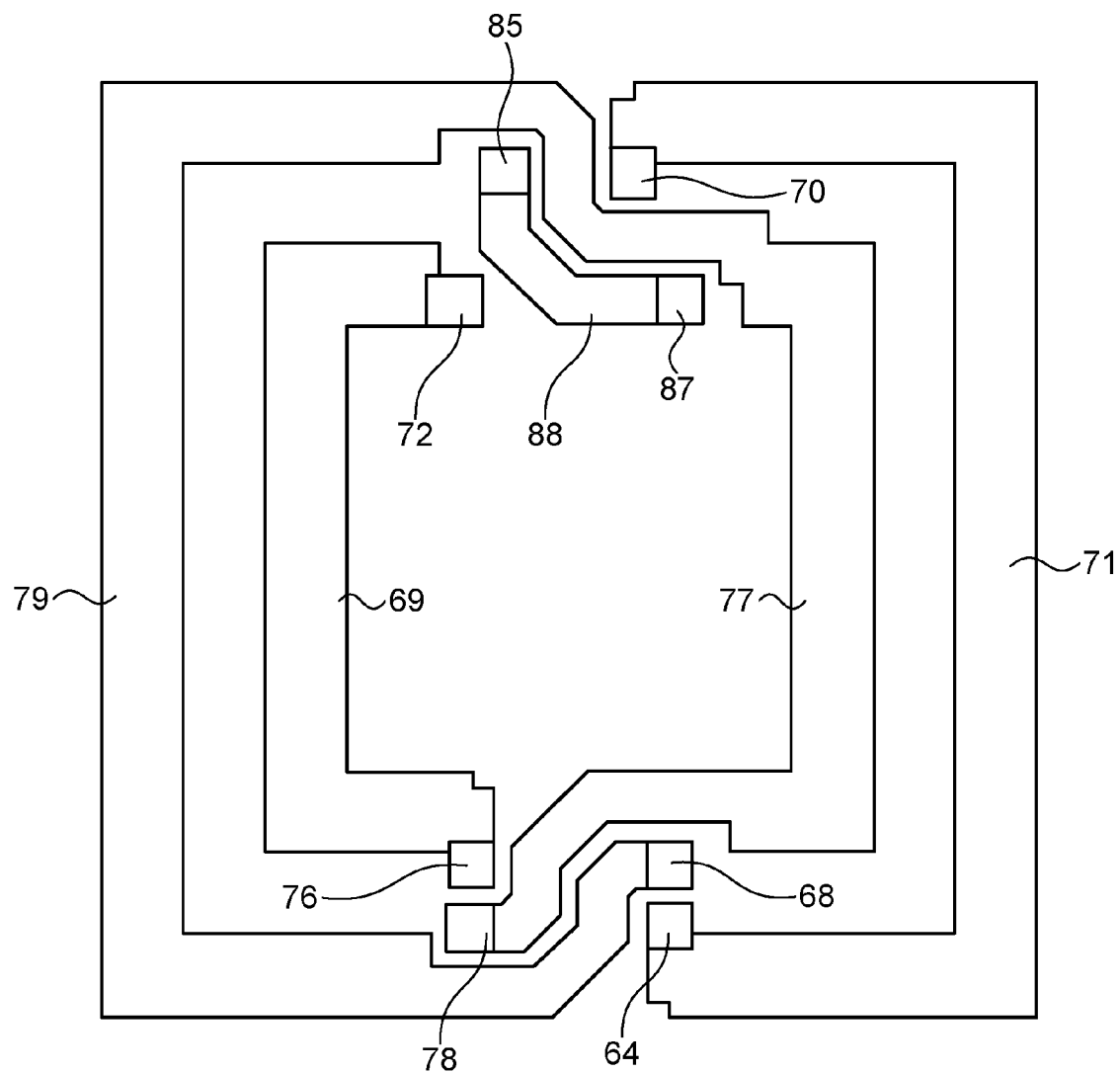
Figure 5:
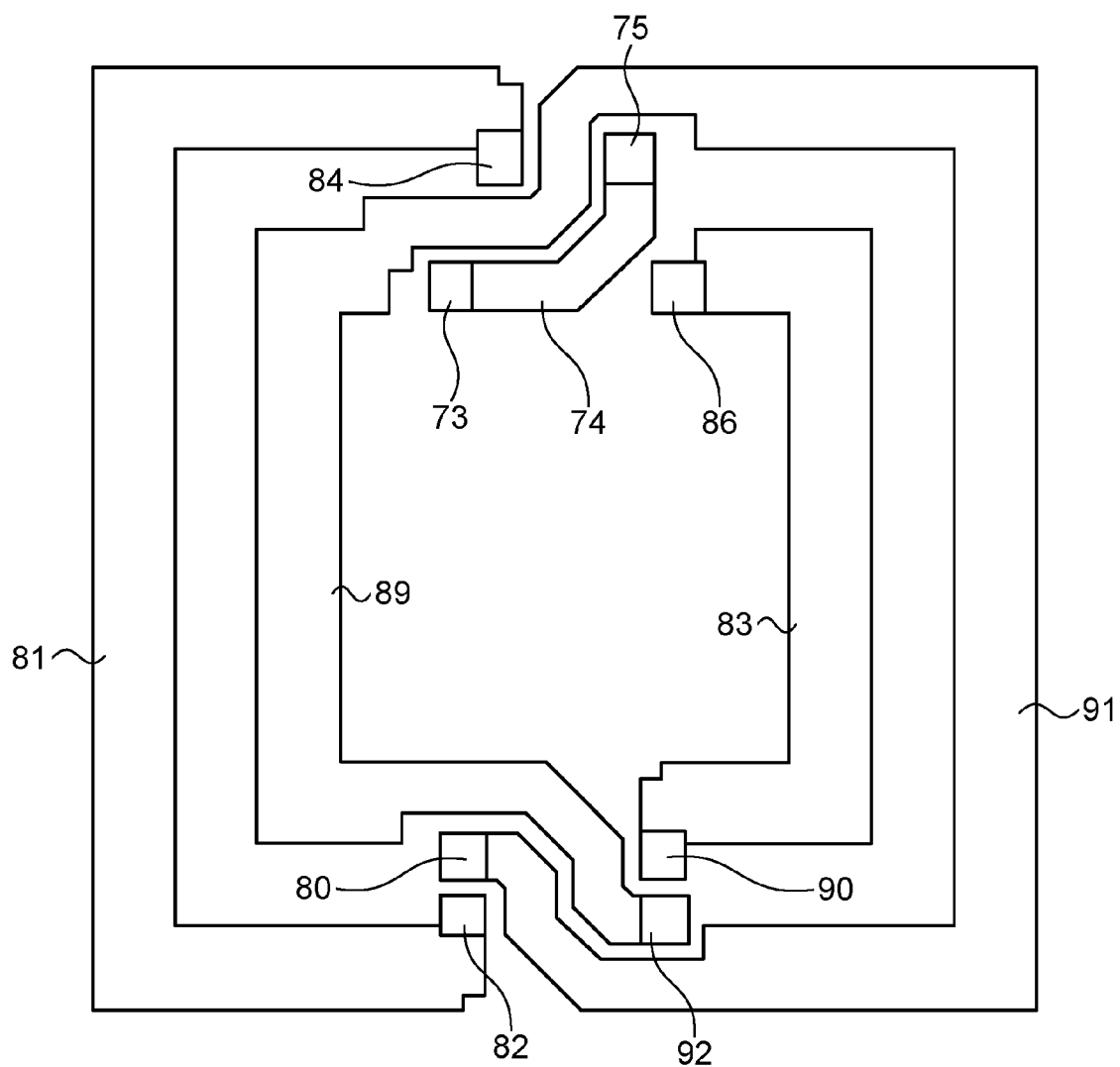

As shown in FIG. 3, the interconnection pattern described above repeats in layer M4, but in mirror image: An outer right trace 49 beginning from pad 44 connects, via a diagonal segment 51 within M4, to an inner left trace 55, thus defining one loop. In the other loop, an outer left trace 50 is connected to an inner right trace 52 by an interconnect segment 56 in layer M5 (FIG. 2). Again, pads 53 and 54 at the ends of traces 50 and 52, respectively, are jumpered through by vias up to corresponding pads 58 and 60 at the ends of segment 56. The two loops in layer M4 are connected by linking vias between pads 62 and 66 to corresponding pads 64 and 68 in layer M3 (FIG. 4).

The mirror-image pair of loop patterns in layers M5 and M4 repeats in each successive pair of layers. Thus, a loop in layer M3 comprising an inner left trace 69 and an outer right trace 71 is closed by an interconnect segment 74 in layer M2 (FIG. 5), having pads 75 and 73 that connect by vias to pads 70 and 72, respectively, in layer M3. The other loop in layer M3 comprises an inner right trace 77 and an outer left trace 79. The two loops in layer M3 are connected to the corresponding loops in layer M2 by linking vias between pads 76 and 78 in M3 and corresponding pads 80 and 82 in M2. A loop in layer M2 comprising an outer left trace 81 and an inner right trace 82 is closed by an interconnect segment 88 in layer M3, connected at pads 85 and 87 by vias to pads 84 and 86 in M2. The other loop in layer M2 comprises an inner left trace 89 and an outer right trace 91.

The table below shows the pattern of loop interconnections:

TABLE I

LOOP INTERCONNECTIONS

| Loop 1 | | | Loop 2 | | |
|---|---|---|---|---|---|
| Outer left | Inter-connect | Inner right | Inner left | Inter-connect | Outer right |
| M5 | M5 | M5 | M5 | M4 | M5 |
| M4 | M5 | M4 | M4 | M4 | M4 |
| M3 | M3 | M3 | M3 | M2 | M3 |
| M2 | M3 | M2 | M2 | M2 | M2 |

The above succession of loops in pairs of layers could continue down indefinitely through as many metal layers as are formed on the IC. In the present embodiment, however, for the sake of brevity, the succession terminates at layer M1: Pads 90 and 92 at the ends of the two loops in layer M2 (FIG. 5) are connected by linking vias to corresponding pads 94 and 96 in M1 (FIG. 6). In this example, M1 contains only a single loop 95, creating a series connection between the ends of the two coils that spiral down through the overlying layers. A common contact 98 may be provided at the meeting point of the two spirals for differential operation.

Figure 7:
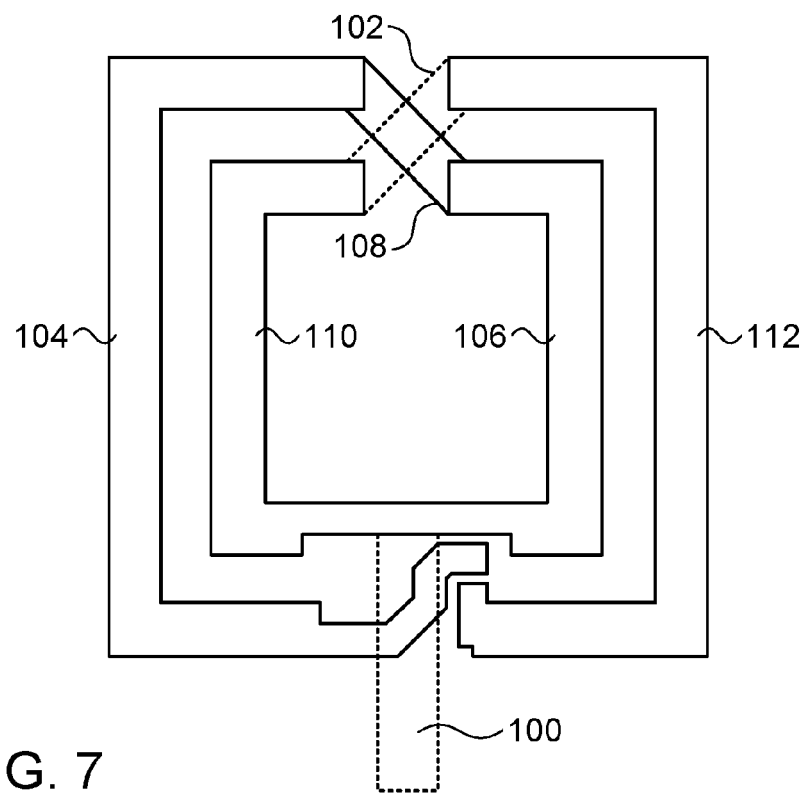
FIG. 7 is a schematic top view of the bottom layer of an IC inductor, in accordance with an alternative embodiment of the present invention.

FIG. 7 is a schematic top view of the bottom layer of an IC inductor, in accordance with an alternative embodiment of the present invention. This figure shows an alternative version of layer M1, which may be substituted for the layer shown in FIG. 6. In the present embodiment, layer M1 includes two loops, with connecting features in the next layer down (M0), although the inductor itself ends in layer M1.

In the embodiment shown in FIG. 7, a loop comprising an outer left trace 104 and an inner right trace 106 is formed entirely in layer M1, with a diagonal connecting segment 108 in M1. Another loop, comprising an inner left trace 110 and an outer right trace 112, is closed by an interconnect segment 102 in layer M0, connected by jumper vias as explained above. A common contact 100, at the point at which the two loops connect to one another, may also be formed in M0.

Figure 8:
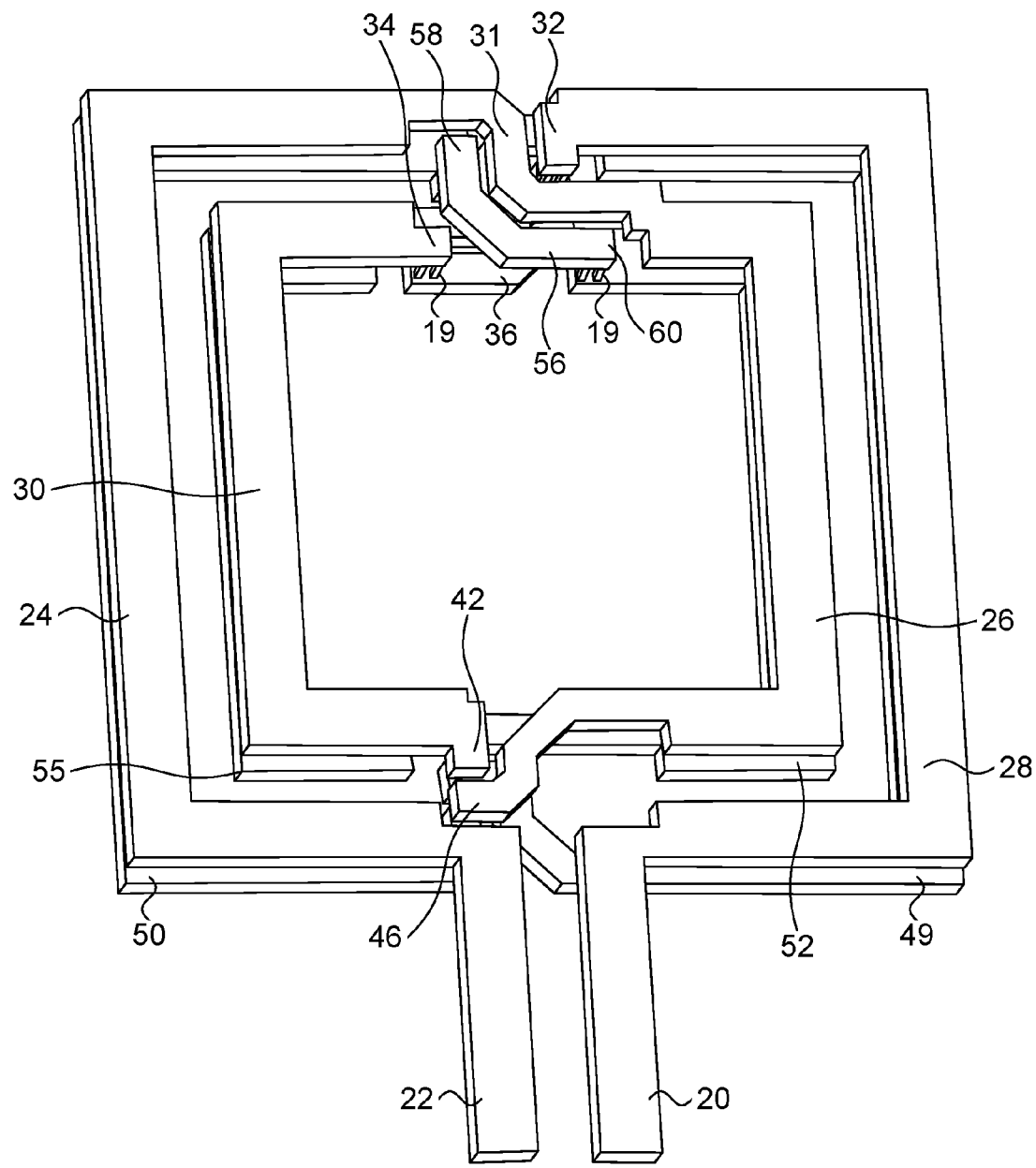
FIG. 8 is a schematic pictorial view of the layers shown in FIGS. 2 and 3, superposed on one another.
Figure 9:
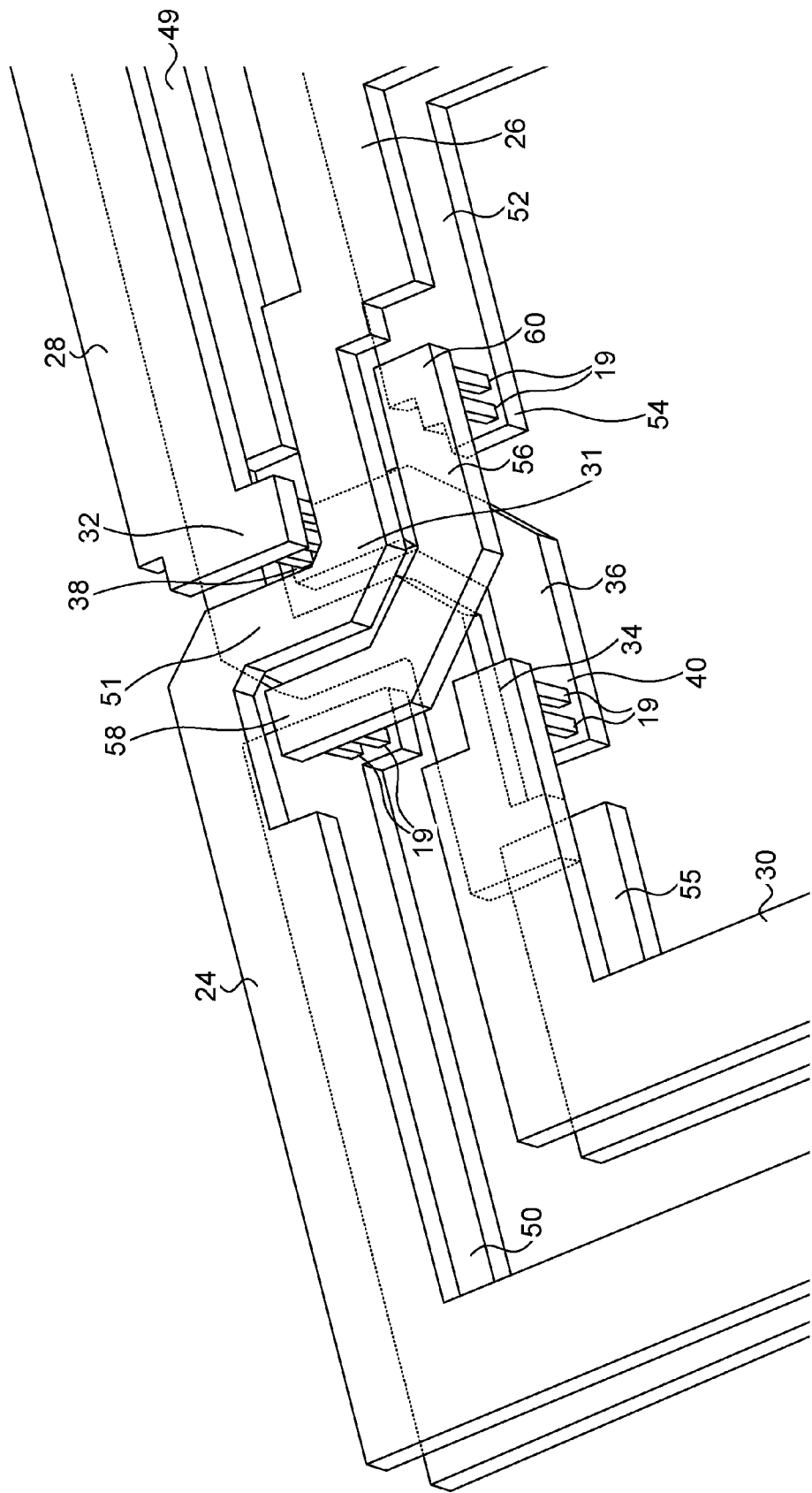
FIG. 9 is a schematic detail view of the layers of FIG. 8, showing interconnect segments and jumpers between the layers.

FIG. 8 is a schematic pictorial view of the layers shown in FIGS. 2 and 3, superposed on one another, while FIG. 9 is a schematic detail view of the layers of FIG. 8, showing interconnect segments 36, 56 and jumpers 19 between the layers. All of the features shown in FIGS. 8 and 9 were described in reference to FIGS. 2 and 3. It can be seen in the preceding figures that the interconnect segment in each layer crosses another interconnect segment in another layer above or below the layer, and this overlap is brought out clearly in the views shown in FIGS. 8 and 9.

Although the attached figures show a particular geometrical layout of the pairs of loops that make up the pictured inductor, other geometrical layouts implementing the topological principles of the above embodiments, with interconnection through jumpers to metal layers above and below, will be apparent to those skilled in the art after reading the present description and are considered to be within the scope of the present invention. As noted earlier, inductive devices of this sort are suited for fabrication in multi-layer circuits of varying types, including not only semiconductor integrated circuit chips, but also circuit structures of other types made up of alternating insulating and conductive layers.

It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. An inductive device formed in a circuit structure comprising alternating conductive and insulating layers, the device comprising:
   in each of a plurality of the conductive layers, including at least a first layer and a second layer, traces forming:
      a first trace forming a loop with an opening,
      a second trace, within the loop of the first trace,
      a third trace, outside the loop of the first trace, and
      an interconnect segment;
   a first pair of vias connecting the interconnect segment of the first layer to the second and third traces of the second layer, such that a conductive loop path with an opening is formed of the second trace on the second layer, the interconnect segment on the first layer, and the third trace on the second layer; and
   a second pair of vias connecting the interconnect segment of the second layer to the second and third traces of the first layer, such that a conductive loop path with an opening is formed of the second trace on the first layer, the interconnect segment on the second layer, and the third trace on the first layer.

2. The device according to claim 1, wherein the circuit structure is an integrated circuit, formed on a semiconductor wafer, with the conductive and insulating layers deposited thereon in alternation.

3. The device according to claim 1, wherein the vias run through an intervening insulating layer between pads at respective ends of the traces and the interconnect segments.

4. The device according to claim 1, wherein the interconnect segments on the first and second layers cross one another diagonally.

5. The device according to claim 1, wherein the plurality of the conductive layers including traces forming the first, second and third traces and the interconnect segment comprises at least three successive conductive layers.

6. The device according to claim 5, wherein the plurality of the conductive layers including traces forming the first, second and third traces and the interconnect segment comprises at least four successive conductive layers.

7. The device according to claim 1, wherein the traces in the plurality of the conductive layers are interconnected in series by additional vias between the conductive layers.

8. A method for producing an inductive device in a circuit structure that includes alternating conductive and insulating layers, the method comprising:
   forming, in each of a plurality of the conductive layers, including at least a first layer and a second layer, traces that define:
      a first trace forming a loop with an opening,
      a second trace, within the loop of the first trace,
      a third trace, outside the loop of the first trace, and
      an interconnect segment;
   forming a first pair of vias connecting the interconnect segment of the first layer to the second and third traces of the second layer, such that a conductive loop path with an opening is formed of the second trace on the second layer, the interconnect segment on the first layer, and the third trace on the second layer; and forming a second pair of vias connecting the interconnect segment of the second layer to the second and third traces of the first layer, such that a conductive loop path with an opening is formed of the second trace on the first layer, the interconnect segment on the second layer, and the third trace on the first layer.

9. The method according to claim 8, wherein the circuit structure is an integrated circuit, formed on a semiconductor wafer, and wherein forming the traces comprises depositing the conductive and insulating layers on the semiconductor wafer in alternation.

10. The method according to claim 8, wherein forming the vias comprises forming vias that run through an intervening insulating layer between pads at respective ends of the traces and the interconnect segments.

11. The method according to claim 8, wherein the interconnect segments on the first and second layers cross one another diagonally.

12. The method according to claim 8, wherein forming the traces comprises forming the first, second and third traces and the interconnect segment in at least three successive conductive layers.

13. The method according to claim 12, wherein forming the traces comprises forming the first, second and third traces and the interconnect segment in at least four successive conductive layers.

14. The method according to claim 8, further comprising interconnecting the traces in the plurality of the conductive layers in series by additional vias between the conductive layers.

15. The method according to claim 14, wherein the additional vias connect the first and second traces on the first layer, respectively, to the third and first traces on the second layer.

16. The method according to claim 14, wherein the additional vias connect the traces to create two interleaved coils, which extend from contact pads in the first layer to a penultimate layer among the plurality of the conductive layers.

17. The device according to claim 7, wherein the additional vias connect the first and second traces on the first layer, respectively, to the third and first traces on the second layer.

18. The device according to claim 7, wherein the additional vias connect the traces to create two interleaved coils, which extend from contact pads in the first layer to a penultimate layer among the plurality of the conductive layers.

19. The device according to claim 18, wherein the device comprises in a last conductive layer adjacent to the penultimate layer, a trace defining a further loop, which is connected by further vias to the traces of the two interleaved coils in the penultimate layer.

20. The device according to claim 18, wherein the device comprises in a last conductive layer adjacent to the penultimate layer a trace defining a further pair of loops that are connected by further vias to the traces of the two interleaved coils in the penultimate layer.

21. The method according to claim 16, wherein the method comprises forming in a last conductive layer adjacent to the penultimate layer a trace defining a further loop that is connected by further vias to the traces of the two interleaved coils in the penultimate layer.

22. The method according to claim 16, wherein the method comprises forming, in a last conductive layer adjacent the penultimate layer a trace defining a further pair of loops connected by further vias to the traces of the two interleaved coils in the penultimate layer.

* * * * *